United States Patent [19]

Owen et al.

[11] Patent Number: 5,593,606
[45] Date of Patent: Jan. 14, 1997

[54] ULTRAVIOLET LASER SYSTEM AND METHOD FOR FORMING VIAS IN MULTI-LAYERED TARGETS

[75] Inventors: Mark D. Owen, Beaverton; James N. O'Brien, Bend, both of Oreg.

[73] Assignee: Electro Scientific Industries, Inc., Portland, Oreg.

[21] Appl. No.: 276,797

[22] Filed: Jul. 18, 1994

[51] Int. Cl.$^6$ .................................................. B23K 26/00
[52] U.S. Cl. .................................. 219/121.71; 219/121.8
[58] Field of Search ......................... 219/121.61, 121.69, 219/121.71, 121.78, 121.8, 121.85, 121.7; 216/65, 66, 94; 427/554, 555, 556; 437/173; 264/400

[56] References Cited

U.S. PATENT DOCUMENTS

| | | |
|---|---|---|
| 3,562,009 | 2/1971 | Cranston et al. . |
| 3,931,458 | 1/1976 | Dini ........................................ 358/297 |
| 4,761,786 | 8/1988 | Baer ........................................ 372/10 |
| 4,832,788 | 5/1989 | Nemiroff ................................. 156/643 |
| 4,894,115 | 1/1990 | Eichelberger et al. ............. 219/121.69 |
| 4,915,981 | 4/1990 | Traskos et al. ........................ 427/53.1 |
| 5,063,280 | 11/1991 | Inagawa et al. ..................... 219/121.7 |
| 5,073,687 | 12/1991 | Inagawa et al. ..................... 219/121.7 |
| 5,453,315 | 9/1995 | Hamilton et al. ........................ 428/209 |

(List continued on next page.)

FOREIGN PATENT DOCUMENTS

| | | |
|---|---|---|
| 0580408 | 1/1994 | European Pat. Off. . |
| 3619342 | 12/1987 | Germany . |
| 63-025913 | 2/1988 | Japan . |

OTHER PUBLICATIONS

"Dopant–Induced Excimer Laser Ablation of Poly(tetrafluoroethylene)," Applied Physics B:Photo–Physics and Laser Chemistry, Mar. 92, vol. b54, No. 3, C R Davis et al, pp. 227–230.

"Etch–Stop Polymer Machining with an Argon Ion Laser," IBM Technical Disclosure Bulletin, Jan. 1993, vol. 36., No. 1, Armonk, NY, US, p. 254.

Pete Singer, "The Interconnect Challenge: Filling Small, High Aspects Ratio Contact Holes," *Semiconductor International*, Aug. 1994, pp. 57–64.

(List continued on next page.)

*Primary Examiner*—Teresa J. Walberg
*Assistant Examiner*—Gregory L. Mills
*Attorney, Agent, or Firm*—Stoel Rives LLP

[57] ABSTRACT

The output of a continuously pumped, Q-switched, Nd:YAG laser (10) is frequency converted to provide ultraviolet light (62) for forming vias (72, 74) in multi-layered targets (40). The parameters of the output pulses (62) are selected to facilitate substantially clean, simultaneous or sequential drilling or via formation in a wide variety of materials such as metals, organic dielectrics, and reinforcement materials having different thermal absorption characteristics in response to ultraviolet light. These parameters typically include at least two of the following criteria: high average power of greater than about 100 milliwatts measured over the beam spot area, a temporal pulse width shorter than about 100 nanoseconds, a spot diameter of less than about 50 microns, and a repetition rate of greater than about one kilohertz. The laser system (10) and method circumvent conventional depth of cut saturation limitations and can achieve an increased depth of cut per pulse in a target (40) formed of either single- or multi-layered material.

30 Claims, 2 Drawing Sheets

U.S. PATENT DOCUMENTS

| | | |
|---|---|---|
| 5,087,396 | 2/1992 | Zablotny et al. . |
| 5,108,785 | 4/1992 | Lincoln et al. . |
| 5,153,408 | 10/1992 | Handford et al. ............... 219/121.64 |
| 5,168,454 | 12/1992 | LaPlante et al. .................. 219/121.8 |
| 5,194,713 | 3/1993 | Egitto et al. ..................... 219/121.71 |
| 5,293,025 | 3/1994 | Wang ............................... 219/121.71 |
| 5,378,869 | 1/1995 | Marrs et al. ..................... 219/121.71 |

OTHER PUBLICATIONS

"Printed Circuit Operations—A View from Inside," Unisys.

Richard Harris et al., "MCM Micromachining: Nd:YAG UV Laser Process is a New Option," Electro Scientific Industries, Inc., Spring 1993.

"LaserPulse," Electro Scientific Industries, Inc., Fall 1993, pp. 1–7.

Y. S. Liu, "Laser Metal Deposition for High–Density Interconnect," *Optics & Photonics News,* Jun. 1992, pp. 10–14.

Friedrich G. Bachmann, "Large scale industrial application for excimer–lasers; via–hole–drilling by Photo–ablation," SPIE, vol. 1361, Physical Concepts of Materials for Novel Optoelectronic Device Applications, 1990, pp. 500–511.

ULTRAVIOLET LASER SYSTEM AND METHOD FOR FORMING VIAS IN MULTI-LAYERED TARGETS

TECHNICAL FIELD

The invention relates to lasers and, in particular, to a method and an apparatus for employing ultraviolet light to form vias in targets having at least two layers with different thermal absorption characteristics in response to ultraviolet light.

BACKGROUND OF THE INVENTION

The background is presented herein only by way of example to multi-chip modules (MCMs), which are multi-material, multi-layered devices that are becoming one of the electronics packaging industry's most preferred components for a variety of aerospace, computer, military, and telecommunications applications. MCMs are replacing or reducing the complexity of printed circuit boards, thus enhancing product efficiency and reliability. MCMs present, however, new manufacturing obstacles because they require smaller vias and finer lines, and use a variety of new materials. Vias are discussed herein only by way of example and may take the form of complete through-holes or incomplete holes called blind vias.

MCMs and other multi-material, multi-layered electronic devices for packaging single chips such as ball grid arrays, pin grid arrays, etc; circuit boards; and hybrid and semiconductor microcircuits typically include separate component layers of metal and an organic dielectric and/or reinforcement materials. The standard metal component layer(s) may contain aluminum, copper, gold, molybdenum, nickel, palladium, platinum, silver, titanium, or tungsten, or combinations thereof. These layers typically have a depth or thickness of about 9–36 μm (where $7.8 \times 10^{-3}$ kg of metal equals a thickness of about 9 μm), but may be thinner or as large as 72 μm. A standard organic dielectric layer may include bismaleimide triazine (BT), cardboard, cyanate esters, epoxies, phenolics, polyimides, or polytetrafluoroethylene (PTFE). These layers typically have a depth of about 50–400 μm. A standard reinforcement component "layer" may include fiber matts or dispersed particles of aramid fibers, ceramics, glass, or Kevlar™ woven or dispersed into the organic dielectric layer to reinforce it. These reinforcements typically have a diameter or thickness of about 1–10 μm. Stacks having several layers of metal, dielectric, and reinforcement material may be larger than 2 mm.

Traditional tools, punches, and production processes are designed for machining larger, less dense components. For example, well-known mechanical processes are either inadequate or prohibitively expensive for generating vias with diameters as small as 12 μm. Even when miniaturization is not the chief issue, mechanical processes are still inadequate. For example, laminate circuit board applications are plagued by the wear of mechanical drills on the laminate and therefore entail the frequent and expensive sharpening or replacement of tools. Furthermore, conventional chemical or wet processes cannot be used to etch certain materials, such as Teflon™ dielectrics. Finally, electron milling, i.e., ion etching, is very expensive and too slow to process MCMs and most other electronic components.

Much work has been directed toward developing laser-based micromachining techniques to process these types of electronic materials. However, laser types, operating costs, and laser- and target material-specific operating parameters such as beam wavelength, power, and spot size vary widely.

Conventional Excimer lasers, for example, may generate laser output wavelengths from about 200 to 350 nm, but create poor quality multi-mode beam structures that simple lens elements cannot bring to a tight focus and, consequently, must be tailored by complex and expensive beam-shape controlling masks or apertures. Thus, an excimer laser beam cannot practically be of a high power density comparable to that achievable by the invention. These lasers are also generally limited to repetition rates of less than 200 Hz and are, therefore, too slow for deployment as a production tool for a variety of desirable applications. In addition, the high cost of excimer systems and their gases prevents their easy deployment and puts them beyond the reach of many small and mid-sized manufacturers. The halogen gases used in excimer laser processing chemically react with the components of the resonator and thereby cause degradation and frequent replacement. Moreover, halogen gases are materials that are hazardous, toxic, and damaging to the environment.

Conventional $CO_2$ lasers, on the other hand, typically generate laser output wavelengths of about 10.6 μm, creating spot sizes that are too large for conventionally desirable via processing. As compared with ultraviolet lasers, $CO_2$ and other IR lasers have considerably longer pulse widths and much wider variance in the absorptivity of the organic materials and metals. These characteristics result in a destructively thermal, rather than photochemical, process.

The need for a beam-shape controlling mask in conjunction with an excimer laser limits the depth of cut per pulse one can achieve with an excimer laser beam, irrespective of whether the target is multi-layered. This is true after the excimer laser beam reaches a particular output power density that produces in the target material a so-called saturation depth of cut per pulse that cannot be increased with an increase in beam output power density. The mask method forces ablation of a large area rather than at a point.

SUMMARY OF THE INVENTION

An object of the present invention is, therefore, to provide an ultraviolet laser system and method for forming vias in multi-layered targets having different chemical compositions and optical absorption characteristics in response to ultraviolet light.

Another object of the invention is to provide such a system and method for achieving a depth of cut while averting the rate slowing effects of a saturation depth per pulse phenomenon in a target formed of either single- or multi-layered material.

A preferred embodiment of the present invention quadruples the frequency of the output of a continuously pumped, Q-switched, Nd:YAG laser to generate ultraviolet light output pulses. The parameters of the output pulses are selected to facilitate substantially clean, simultaneous drilling or via formation in a wide variety of materials such as metals, organic dielectrics, and reinforcement materials having different thermal absorption characteristics in response to ultraviolet light. These parameters typically include at least two of and preferably all of the following criteria: high average power of greater than about 100 milliwatts measured over the beam spot area, a temporal pulse width shorter than about 100 nanoseconds, a spot diameter of less than about 50 microns, and a repetition rate of greater than about one kilohertz.

An advantage of the present invention is that the laser system output pulses generated and the methods of using them eliminate the saturation limit on the power density ablation rate per pulse. This allows full use of the much higher pulse rate and ablation rate per pulse properties of the invention than those possible with like profile pulses produced by an excimer laser. This is true irrespective of whether the target is of single- or multi-layered material.

Additional objects and advantages of the present invention will be apparent from the following detailed description of a preferred embodiment thereof, which proceeds with reference to the accompanying drawings.

DETAILED DESCRIPTION OF A PREFERRED EMBODIMENT

Figure 1:
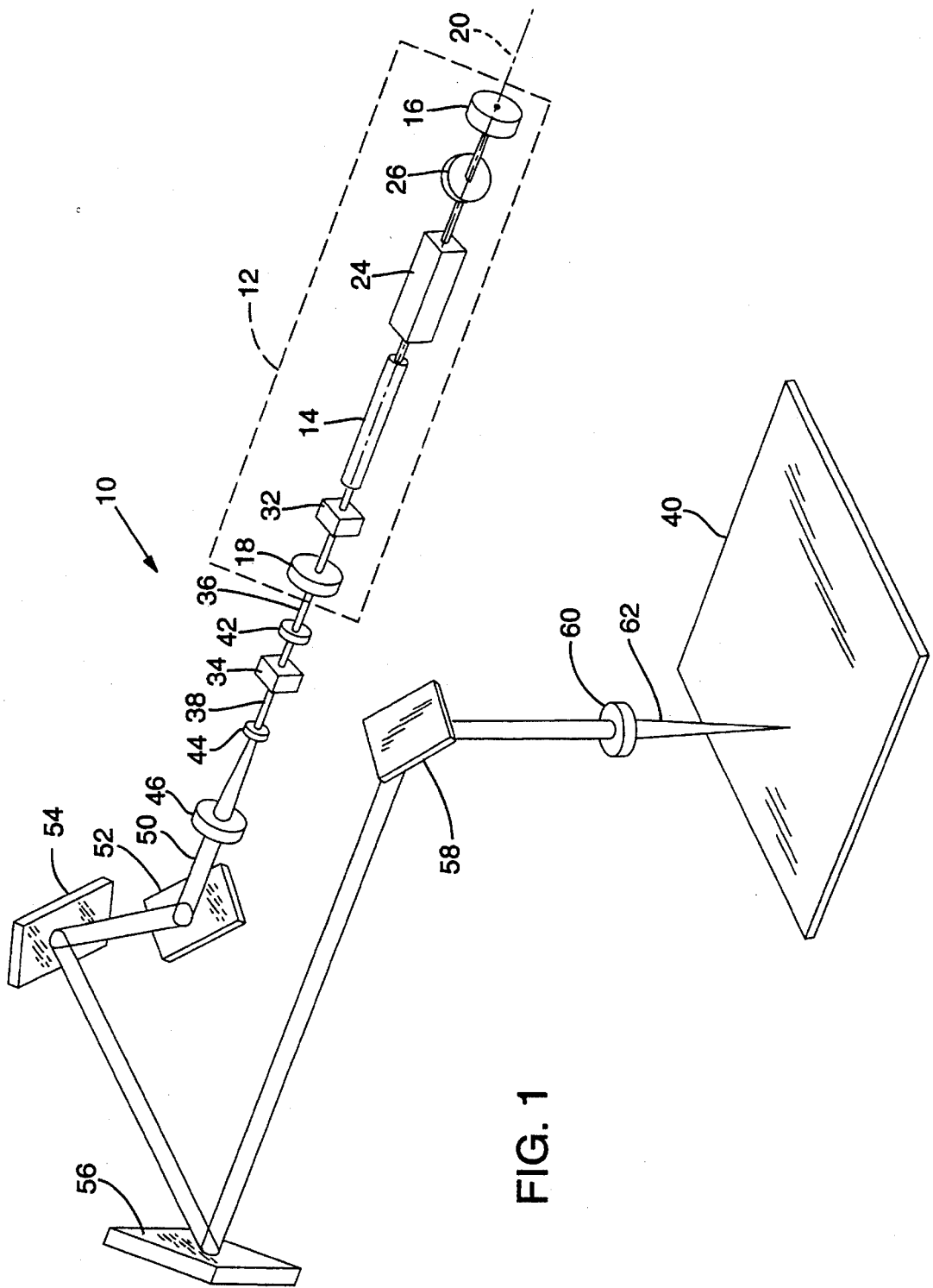
FIG. 1 is an isometric view of the components of a simplified laser system employed for generating desirable laser pulses in accordance with present invention.

With reference to FIG. 1, a preferred embodiment of a laser system 10 of the present invention includes a resonator 12 defined by a laser rod 14 positioned between a rear mirror 16 and an output mirror 18 along an optic axis 20. Mirror 16 is preferably 100% reflective, and mirror 18 is partly transmissive to light propagating along optic axis 20. Laser rod 14 preferably includes a solid-state lasant such as Nd:YAG, Nd:YLF, Nd:YAP, or Nd:YVO$_4$, or a YAG crystal doped with holmium or erbium. Laser rod 14 may be pumped by a variety of pumping sources (not shown) well-known to persons skilled in the art, but a krypton arc lamp is or a suitable diode laser would be preferred for laser system 10 of the present invention.

Q-switches and their uses, positioning, and operation are also well-known to persons skilled in the art. In laser system 10, a Q-switch 24 is preferably positioned within resonator 12 along optic axis 20 between laser rod 14 and mirror 16.

The output of laser rod 14 is converted to a preferred ultraviolet wavelength through two stages of harmonic generation or frequency doubling. Second harmonic generation may be produced by a first frequency converter 32 such as a nonlinear crystal inserted along optic axis 20 and angle-tuned for optimum phase matching with the output of laser rod 14. Skilled persons will appreciate that there are numerous other techniques conventionally employed for phase matching. The amount of energy converted to the second harmonic is a function of a number of laser characteristics including peak power, mode structure, and beam divergence of the fundamental wavelength. Pertinent factors for selecting a particular nonlinear crystal include nonlinear coefficients, angular acceptance, and damage threshold.

In a preferred laser system 10 that is a continuously pumped, Q-switched, Nd:YAG laser, frequency doubling is efficiently accomplished with a barium borate crystal 32 positioned within resonator 12 along optic axis 20, as shown in FIG. 1. Skilled persons will appreciate that numerous other frequency converting crystals might be used, such as lithium borate.

The doubling process is enhanced by a Brewster plate polarizer 26 preferably positioned between rear mirror 16 and laser rod 14. In addition, output mirror 18 is selected to be highly reflective to the fundamental wavelength generated by laser rod 14 (1064 nm for a Nd:YAG) to increase the intracavity peak power, thereby increasing the harmonic conversion (to 532 nm) efficiency by as much as 80%.

A second frequency converter 34 (also preferably barium borate) is positioned along optic axis 20 external to resonator 12 to produce the fourth harmonic output 38 (266 nm) of the fundamental wavelength, i.e. the second harmonic of resonator output 36, with a conversion efficiency of approximately 25%. The resonator output 36 may be separated into the two wavelengths, (532 nm and 266 nm) with one or more beamsplitters (not shown). The fourth harmonic output 38 at 266 nm may also be varied by rotating the input polarization of the 532 nm resonator output 36 with a polarization state changer 42 positioned along optic axis 20. Polarization state changer 42 may be a quarter-wave plate or a variable polarization state changer under operative control of a central processing unit (not shown) such as described in U.S. patent application No. 08/064,515 filed May 18, 1993, assigned to the assignee of this application, and herein incorporated by reference.

The fourth harmonic output 38 may be manipulated by a variety of well-known optics including beam expander lens components 44 and 46 that are positioned along beam path 50 before a series of beam-directing reflectors 52, 54, 56, and 58. Finally, the fourth harmonic output 38 is passed through a focusing lens 60 before being applied as processing output beam 62 to target 40. Other preferred wavelengths of processing output beam 62 include 213 nm (frequently quintupled) and 355 nm (frequency tripled). Skilled persons will appreciate that frequency converter 34 would be preferably positioned within resonator 12 if frequency tripling is desired.

The parameters of processing output beam 62 are selected to facilitate substantially clean, sequential or simultaneous drilling, i.e., via formation, of a wide variety of multi-material targets. Such targets may comprise, for example, organic dielectrics, reinforcement materials, and/or metals which exhibit different optical absorption and other characteristics in response to ultraviolet light (i.e., wavelengths shorter than about 400 nm). The preferred parameters of processing output beam 62 are selected in an attempt to circumvent at least some of the thermal damage effects by utilizing temporal pulse widths that are shorter than about 100 ns, and preferably from about 40–90 ns or lower. Other preferred parameters include average powers greater than about 100 mW measured over the beam spot area; spot size diameters or spatial major axes of less than about 50 µm, and preferably from about 10–50 µm; and a repetition rate of greater than about 200 Hz, preferably greater than about 1 kHz or even 5 kHz; and an ultraviolet wavelength, preferably between about 193–355 nm. Skilled persons will also appreciate that the spot area of output beam 62 is generally circular, but may be very slightly elliptical.

Figure 2:
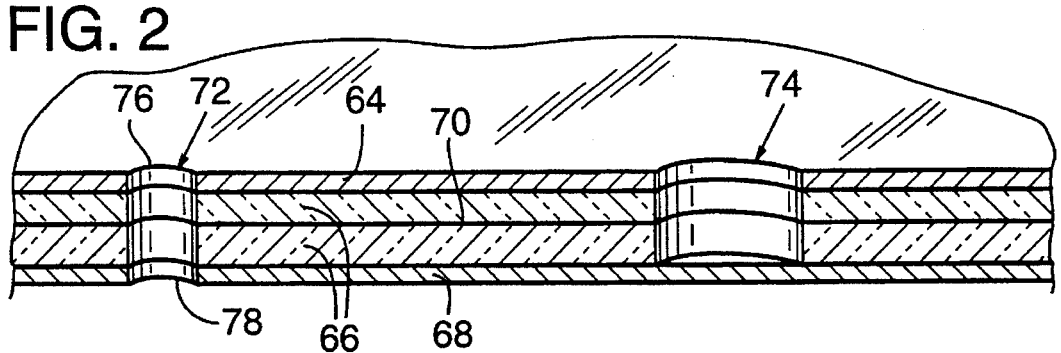
FIG. 2 is an enlarged sectional side elevation view of a multi-layered target having a through-hole and a blind via.

FIG. 2 is a cross-sectional side view of an enlarged portion of a generic laser target 40 that may, for example, be an MCM, capacitor, resistor, or hybrid or semiconductor microcircuit. For convenience, target 40 is depicted as having only four layers, 64, 66, 68, and 70.

Layers 64 and 68 may contain, for example, standard metals such as, aluminum, copper, gold, molybdenum, nickel, palladium, platinum, silver, titanium, tungsten, metal nitrides, or combinations thereof. Conventional metal layers vary in thickness, typically between 9–36 µm, but may be thinner or as thick as 72 µm. Layer 66 may, for example, contain a standard organic dielectric material such as BT, cardboard, cyanate esters, epoxies, phenolics, polyimides, PTFE, various polymer alloys, or combinations thereof. Conventional organic dielectric layers 66 vary considerably in thickness, but are typically much thicker than metal layers 64 and 68. An exemplary thickness range for organic dielectric layers 66 is about 50–200 µm, but they may be placed in stacks as large as 1.6 mm. A standard reinforcement component or "layer 70" may be fiber matte or dispersed particles of, for example, aramid fibers, ceramics, glass, or Kevlar™ woven or dispersed into organic dielectric layer 66. Conventional reinforcement layers 70 are typically much thinner than organic dielectric layers 66 and may be on the order of 1–2 μm and perhaps up to 10 μm. Skilled persons will appreciate that reinforcement material may be introduced as powders into the organic dielectrics. The "layers 70" formed by such powdery reinforcement material may be noncontiguous and nonuniform. Skilled persons will also appreciate that layers 64, 66, and 68 may also be internally noncontiguous, nonuniform, and nonlevel.

Target 40 in FIG. 2 also depicts a through-hole via 72 and a blind via 74 produced by laser system 10. Through-hole 72 cleanly and evenly penetrates all layers and materials of target 40 and exhibits negligible taper from its top 76 to its bottom 78. Blind via 74 does not penetrate all layers and/or materials. In FIG. 2, blind via 74 stops at and does not penetrate layer 68. Thus, proper selection of the laser parameters permits layer 68 to remain unaffected even if it comprises the same metal component(s) as layer 64.

Figure 3A:
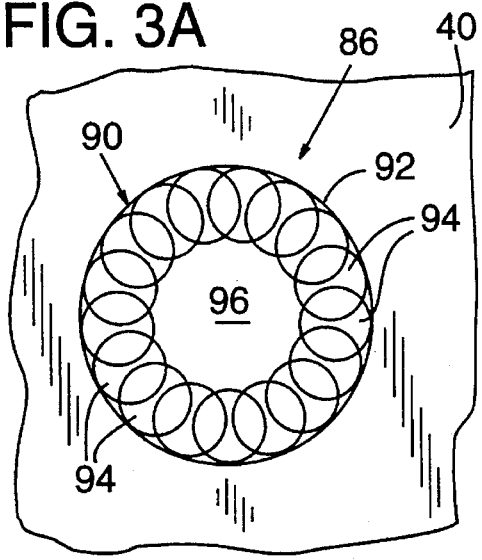
FIGS. 3A and 3B show cutting profiles for forming a through-hole and a blind via, respectively.
Figure 3B:
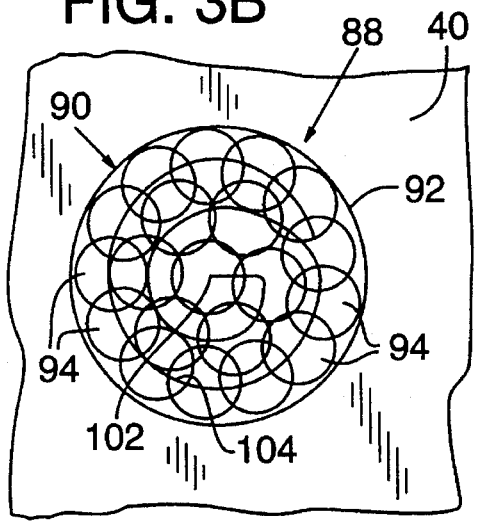

Via diameters preferably range from 25–300 μm, but laser system 10 may produce vias 72 and 74 that are as small as about 5–25 μm or much greater than 1 mm. Because the preferred spot size of output beam 62 is about 25 μm in diameter, vias larger than 25 μm may be produced by trepanning, concentric circle processing, or spiral processing. FIGS. 3A and 3B show cutting profiles for forming a through-hole 86 and a blind via 88, respectively, that are larger than the spot size of output beam 62.

With reference to FIG. 3A, through-hole 86 defines on the surface of target 40 a circular spatial region 90 having a periphery 92. Output beam 62 has a spot area 94 that is less than the area of region 90. Through-hole 86 is formed by sequentially positioning beam 62 having spot area 94 at overlapping contiguous locations around periphery 92. Beam 62 is kept at each location for sufficient time for system 10 to deliver the number of beam pulses necessary to achieve the depth of cut at the location. After beam 62 completes the path around periphery 92, the center target material 96 falls out to form through-hole 86. This process is called trepanning.

With reference to FIG. 3B, blind via 88 also defines on the surface of target 40 a circular region 90 having a periphery 92. Output beam 62 having spot area 92 is initially positioned at the center 102 of region 90. Blind via 88 is formed by sequentially positioning beam 62 having spot area 94 at overlapping contiguous locations along a spiral path 104 to periphery 92. Beam 62 is kept at each location for sufficient time for system 10 to deliver the number of beam pulses necessary to achieve the depth of cut at the location. As beam 62 proceeds along spiral path 104, the target material is "nibbled" away to form a hole of increasing size each time beam 62 is moved to a new cutting location. The final shape of the hole is achieved when beam 62 moves along a circular path at periphery 92.

An alternative beam cutting path to form blind via 88 would be to start at center 102 and cut concentric circles of incrementally increasing radii defined by spot area 94 of beam 62. The overall diameter of via 88 would increase as the concentric circles forming via 88 travel in a circular path at greater distances from center 102 of region 90. Alternatively, this process may begin by defining the desired circumference and processing the edges toward the center.

Outward spiral processing tends to be a little more continuous and quicker than concentric circle processing. Skilled persons will appreciate that either target 40 or processing output beam 62 may be fixed or moved relative to the position of the other.

Several examples of through-hole vias and blind vias of various depths and diameters produced on a number of different substrates are set forth below. These vias were all produced with a Model 4575 UV laser (generally at 266 nm) in a Model 4420 laser system manufactured by Electro Scientific Industries, Inc. in Portland, Oreg., the assignee of the present application.

EXAMPLE 1

With reference to Table 1, through-holes (samples 1–5) and blind vias (samples 6–9) were produced on 190.5 μm thick, three-layered copper/FR4 (a level 4 fire retardant epoxy-glass composition)/copper targets. These experiments were conducted with a 25 mm lens. Through-holes and blind vias having a diameter larger than 51 μm were produced by concentric circles with 10 mm pitch. The average power was about 260 mW at a repetition rate of 2 kHz.

TABLE 1

TEST RESULTS ON COPPER/FR4/COPPER

| Sample # | Via Diameter (μm) | Speed (mm/s) | Bite Size (μm) | Rep Rate (kHz) | # Passes | Taper (μm) | Throughput (holes/sec) |
|---|---|---|---|---|---|---|---|
| VIA DRILLING | | | | | | | |
| 1 | 25 | 0.4 | 0.2 | 2 | 2 | 5 | 2.3 |
| 2 10 × 10 array | 51 | 4.0 | 2.0 | 2 | 6 | 12 | 3.9 |
| 3 10 × 10 array | 102 | 7.0 | 3.0 | 2.3 | 12 | 9 | 1.9 |
| 4 10 × 10 array | 152 | 7.0 | 7.0 | 2.3 | 13 | 10 | 1.1 |
| 5 10 × 10 array | 203 | 7.0 | 7.0 | 2.3 | 14 | 12 | .79 |

TABLE 1-continued

TEST RESULTS ON COPPER/FR4/COPPER

| Sample # | Via Diameter (μm) | Speed (mm/s) | Bite Size (μm) | Rep Rate (kHz) | # Passes | Taper (μm) | Throughput (holes/sec) |
|---|---|---|---|---|---|---|---|
| BLIND VIAS DRILLING | | | | | | | |
| 6<br>3 × 3 array | 51 | 3.0 | 3.0 | 1 | 2 | — | 6.9 |
| 7<br>3 × 3 array | 102 | 2.0 | 0.75 | 2.7 | 1 | — | 1.4 |
| 8<br>3 × 3 array | 152 | 3.0 | 3.0 | 1 | 2 | — | 0.36 |
| 9<br>3 × 3 array | 203 | 3.0 | 3.0 | 1 | 2 | — | 0.21 |

EXAMPLE 2

With reference to Table 2, blind vias were produced on two samples of 1.6 mm thick, three-layered copper/epoxy glass prepeg/copper targets. These experiments were conducted with a 50 mm lens. Sample 1 had pre-existing vias through one of the copper layers to test the efficacy of removing the epoxy glass prepeg material. The 203 μm diameter vias were produced by spiral cutting to remove the material in the center of the via. The average power was about 270 mW at a repetition rate of 2 kHz.

TABLE 2

TEST RESULTS ON COPPER/EPOXY GLASS PREPEG/COPPER

| Sample # | Via Diameter (μm) | Speed (mm/s) | Bite Size (μm) | Rep Rate (kHz) | # Passes | Taper (μm) | Throughput (holes/sec) |
|---|---|---|---|---|---|---|---|
| 1 | 203 | 4.75 | 2 | 2.4 | 1 | — | 0.9 |
| 2 | 51 | 4.75 | 2 | 2.4 | 2 | — | 8.4 |

EXAMPLE 3

With reference to Table 3, through-holes (samples 1–5) and blind vias (6–9) were produced on 178 μm thick, three-layered copper/liquid crystal polymer/copper targets. These experiments were conducted with a 25 mm lens. The blind vias were cut using concentric circles with a pitch of 15 μm. The average power was about 300 mW at a repetition rate of 2 kHz.

TABLE 3

TEST RESULTS ON COPPER/LIQUID CRYSTAL POLYMER/COPPER

| Sample # | Via Diameter (μm) | Speed (mm/s) | Bite Size (μm) | Rep Rate (kHz) | # Passes | Taper (μm) | Throughput (holes/sec) |
|---|---|---|---|---|---|---|---|
| VIA DRILLING | | | | | | | |
| 1<br>10 × 10 array | 25 | 4.5 | 1.5 | 3 | 5 | 7 | 4.5 |
| 2<br>10 × 10 array | 51 | 4.5 | 1.5 | 3 | 5 | 7 | 4.5 |
| 3 | 76 | 7.0 | 2.0 | 3.5 | 8 | 9 | 3.1 |

TABLE 3-continued

TEST RESULTS ON COPPER/LIQUID CRYSTAL POLYMER/COPPER

| Sample # | Via Diameter (μm) | Speed (mm/s) | Bite Size (μm) | Rep Rate (kHz) | # Passes | Taper (μm) | Throughput (holes/sec) |
|---|---|---|---|---|---|---|---|
| 4 10 × 10 array | 102 | 9.0 | 3.0 | 3 | 12 | 7 | 2.2 |
| 5 10 × 10 array | 127 | 12.0 | 4.0 | 3 | 14 | 6 | 1.9 |
| BLIND VIAS |
| 6 3 × 3 array | 70 | 3 | 3.0 | 1 | 2 | — | 0.70 |
| 7 3 × 3 array | 88 | 3 | 3.0 | 1 | 2 | — | 0.52 |
| 8 3 × 3 array | 121 | 3 | 3.0 | 1 | 2 | — | 0.35 |
| 9 3 × 3 array | 141 | 3 | 3.0 | 1 | 2 | — | 0.28 |

EXAMPLE 4

With reference to Table 4, through-holes were produced on two samples of 533 μm thick, two-layered copper-clad, glass-reinforced polyimide targets.

TABLE 4

TEST RESULTS ON COPPER-CLAD, GLASS-REINFORCED POLYIMIDE

| Sample # | Via Diameter (μm) | Speed (mm/s) | Bite Size (μm) | Rep Rate (kHz) | # Passes | Taper (μm) | Throughput (holes/sec) |
|---|---|---|---|---|---|---|---|
| 1 | 100 | 50 | — | 2 | 5 | 18 | 1.5+ |
| 2 | 100 | 100 | — | 2 | 6 | 18 | 1.5+ |

EXAMPLE 5

With reference to Table 5, through-holes were produced on 254 μm thick, two-layered glass fiber-reinforced cyanate ester (samples 1-3) and 254 μm thick, two-layered random glass powder-reinforced cyanate ester targets. These experiments were performed with 25 mm focal length lens resulting in an effective spot size of about 25 μm. The average power was about 250 mw at a repetition rate of about 3 kHz. The through-holes were trepanned.

TABLE 5

TEST RESULTS ON GLASS (FIBER OR POWDER) - REINFORCED CYANATE ESTER

| Sample # | Via Diameter (μm) | Speed (mm/s) | Bite Size (μm) | Rep Rate (kHz) | # Passes | Taper (μm) | Throughput (holes/sec) |
|---|---|---|---|---|---|---|---|
| 1 | 50 | 5 | — | 2.5 | 4 | — | 5.4 |
| 2 | 89 | 7 | — | 3.5 | 7 | — | 3.5 |
| 3 | 100 | 8 | — | 3.2 | 7 | — | 3.5 |
| 4 | 89 | 8.1 | — | 2.7 | 2 | — | 3.5 |

EXAMPLE 6

With reference to Table 6, through-holes were produced on 100 μm thick, two-layered epoxy glass with 18 μm copper (Hi-Tg. multifunctional Norplex Oak) (sample 1) and 50 μm thick, two-layered aramid reinforced epoxy with 9.0 μm copper (samples 2-3) targets. These experiments were conducted with a 25 mm focal length lens resulting in an effective spot size of 25 μm. The through-holes were trepanned. The average output power was 270 mW at repetition rates of 2.7-4.5 kHz.

TABLE 6

TEST RESULTS ON COPPER-CLAD, EPOXY GLASS OR ARAMID EPOXY

| Sample # | Via Diameter (μm) | Speed (mm/s) | Bite Size (μm) | Rep Rate (kHz) | # Passes | Taper (μm) | Throughput (holes/sec) |
|---|---|---|---|---|---|---|---|
| 1 | 100 | 10  | — | 4   | 5 | 9 | 1.15 |
| 2 | 50  | 3.6 | — | 4.5 | 1 | 9 | 11.7 |
| 3 | 100 | 8.1 | — | 2.7 | 2 | 9 | 6.3  |

EXAMPLE 7

With reference to Table 7, through-holes were produced on 71 μm thick FR4/18 μm copper (samples 1, and 3–5), and 142 μm thick (two-layer stack) FR4/18 μm copper (sample 2). These experiments were conducted with a 25 mm focal length lens resulting in an effective spot size of about 25 μm. The through-holes were trepanned. The average output power was 300 mW at a repetition rate of 4 kHz.

TABLE 7

TEST RESULTS ON COPPER-CLAD FR4

| Sample # | Via Diameter (μm) | Speed (mm/s) | Bite Size (μm) | Rep Rate (kHz) | # Passes | Taper (μm) | Throughput (holes/sec) |
|---|---|---|---|---|---|---|---|
| 1 | 50  | .5 | — | 4 | 2  | 10 | 8.4 |
| 2 | 50  | 5  | — | 4 | 5  | 10 | 9.1 |
| 3 | 100 | 8  | — | 4 | 5  | 10 | 4.6 |
| 4 | 200 | 10 | — | 4 | 8  | 10 | 1.9 |
| 5 | 300 | 10 | — | 4 | 10 | 10 | 1.0 |

EXAMPLE 8

With reference to Table 8, through-hole vias and blind vias were produced on three-layered, 305 μm epoxy glass/18 μm copper (samples 1, 2, and 8); three-layered, 102 μm epoxy glass/18 μm copper (samples 3–5); and three-layered glass polyimide/18 μm copper (samples 6, 7, and 9) targets. These experiments were performed with a 25 mm focal length lens resulting in an effective spot size of 25 μm. The through-holes were trepanned at a uniform power. The blind vias were produced by processing the organic dielectric and the metal layers at different peak powers. The average output power was about 225 mW at repetition rates from 1.5–20 kHz.

EXAMPLE 9

With reference to Table 9, through-hole vias were produced on five 9 μm thick layers/four 50–150 μm thick layers of PTFE targets having a total thickness of about 445 μm. The average output power was about 250 mW.

TABLE 8

TEST RESULTS ON COPPER-CLAD EPOXY GLASS, GLASS POLYIMIDE, AND POLYIMIDE

| Sample # | Via Diameter (μm) | Speed (mm/s) | Bite Size (μm) | Rep Rate (kHz) | # Passes | Taper (μm) | Throughput (holes/sec) |
|---|---|---|---|---|---|---|---|
| 1 | 102 | 8   | — | 3.2 | 15         | 12 | 1.7 |
| 2 | 51  | 3.2 | — | 1.6 | 10         | 12 | 2.4 |
| 3 | 102 | 7.8 | — | 3.1 | 5          | 12 | 4.4 |
| 4 | 51  | 3.2 | — | 2.1 | 2          | 12 | 7.8 |
| 5 | 25  | N/A | — | 4   | 100 pulses | 12 | 15  |
| 6 | 102 | 7.6 | — | 1.5 | 6          | 12 | 3.8 |
| 7 | 51  | 3.2 | — | 1.6 | 4          | 12 | 5.3 |
| 8 | 102 | 8   | — | +5  | 10         | 12 | 2   |
| 9 | 51  | 3.2 | — | +20 | 1          | 12 | 3.7 |

TABLE 9

| Sample # | Via Diameter (μm) | Speed (mm/s) | Bite Size (μm) | Rep Rate (kHz) | # Passes | Taper (μm) | Throughput (holes/sec) |
|---|---|---|---|---|---|---|---|
| 1 | 50 μm | 2 | — | 4 kHz | 5 | 11 μm | 2.0 |
| 2 | 25 μm | — | — | 4 kHz | 50 pulses | — | 8.0 |
| 3 | 125 μm | 2 | — | 2 kHz | 10 | 14 μm | 0.46 |

EXAMPLE 10

With reference to Table 10, through-hole vias and blind vias were produced on 25 μm copper/275 μm BT glass fiber laminate targets. The average output power was about 250 mW.

TABLE 10

| Sample # | Via Diameter (μm) | Speed (mm/s) | Bite Size (μm) | Rep Rate (kHz) | # Passes | Taper (μm) | Throughput (holes/sec) |
|---|---|---|---|---|---|---|---|
| VIA DRILLING | | | | | | | |
| 1 | 50 | 10 | — | 2 kHz | 4 | 10 μm | 0.8 |
| 2 | 100 | 10 | — | 2 kHz | 4 | 15 μm | 0.5 |
| BLIND VIAS | | | | | | | |
|  | 50 | 5 | — | 2 kHz | 1 | — | 2.0 |
|  | 100 | 5 | — | 2 kHz | 1 | — | 0.7 |

A benefit derived from solid-state laser system 10 is the ability to direct output beam 62 onto the surface of target 40 without the use of a beam-shape controlling mask, such as that used with an excimer laser. This is significant because depth of cut per pulse saturation can result when the beam spot area equals the spatial region defined by the via intended to be cut. The saturation depth of cut per pulse is reached when an increase in power density of the beam pulse striking the target does not produce an appreciable increase of depth of cut into the target. This is especially true for the excimer laser because the use of a beam-shape controlling mask dictates that the beam spot area equal the spatial area defined by the via to be cut. Applicants believe that the saturation depth phenomenon is caused by development by the first beam pulse of a debris plume that acts as a filter or mask for subsequent beam pulses. The mask method forces ablation of a large area rather than a point, and the debris plume from the large area becomes a mask that effectively acts as a shield to beam pulses of higher power densities.

Figure 4:
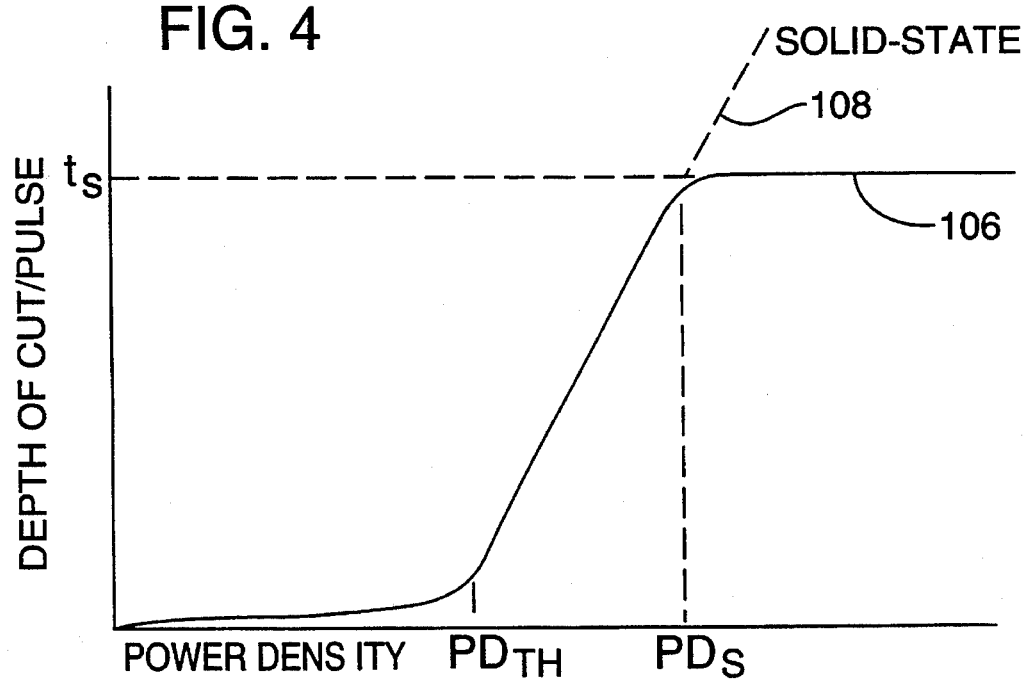
FIG. 4 is a depth of cut per pulse versus power density graph showing qualitatively the comparative relationship of the depth of cut per pulse achievable with an excimer laser and with the present invention.

FIG. 4 is a depth of cut per pulse versus power density graph showing qualitatively the comparative relationship of the depth of cut per pulse achievable with an excimer laser beam and an output beam of laser system 10. Curve 106 characterizes a pulsed excimer laser beam passing through a beam-shape controlling mask and striking a target. Curve 106 shows that an excimer beam pulse exceeding a threshold power density $PD_{TH}$, produces the depth of cut per pulse that increases linearly to a value, $t_s$, that corresponds to a saturation power density, $PD_s$. Further increases in excimer beam pulse power density produce no appreciable increase in depth of cut. Curve 108 characterizes output beam 62 of system 10 without the presence of a beam-shape controlling mask and tracks curve 106 for beam pulse power densities not exceeding $PD_s$. For increases in pulse power densities exceeding $PD_s$, output beam 62 continues the linear increase in depth of cut per pulse without saturation. System 10 is capable, therefore, of achieving depths of cut per pulse commensurate to the available beam pulse power density.

It will be obvious to those having skill in the art that various changes may be made in the details of the above-described embodiment of the present invention without departing from the underlying principles thereof. The scope of the present invention should, therefore, be determined only by the following claims.

We claim:

1. A method for laser processing a multi-layered target including at least two layers having different chemical compositions, comprising:

generating, from a non-excimer laser at a repetition rate of greater than about 1 kHz, high power ultraviolet laser output pulses having a predetermined spatial spot size, a wavelength shorter than about 400 nm, a temporal pulse width shorter than about 100 ns, and an average output power of greater than about 100 mW measured over the spatial spot size; and applying the laser output pulses to the target so that the laser output pulses cleanly remove at least two layers within the spatial spot size.

2. The method of claim 1 in which the layers comprise any combination of at least two of the following chemical compositions: organic dielectric material, reinforcement material, or metal or combination of metals.

3. The method of claim 2 in which the organic dielectric material comprises PTFE, polyimides, epoxies, BT, phenolics, cyanate esters, paper, cardboard, or combinations thereof; the reinforcement material comprises glass, aramid fibers, KEVLAR, ceramics, or combinations thereof; and the metal comprises aluminum, titanium, nickel, copper, tungsten, platinum, gold, molybdenum, palladium, silver, or combinations thereof.

4. The method of claim 3 in which the two layers comprise an organic dielectric material layer and a metal layer.

5. The method of claim 1 in which the wavelength of the laser output pulses is within a range of about 180–400 nm.

6. The method of claim 1 in which the target comprises at least three layers having different chemical compositions and optical absorption characteristics, and the laser output pulses sequentially remove all three layers.

7. The method of claim 1 in which the spatial spot size is less than about 50 μm across its surface diameter.

8. The method of claim 1 in which several pulses are employed to remove a spatial region of the target that is greater than 25 μm in diameter.

9. The method of claim 1 in which the laser output is generated by a solid-state laser.

10. The method of claim 9 in which the solid-state laser is selected from the group of Nd:YAG, Nd:YLF, Nd:YAP, and Nd:YVO$_4$.

11. The method of claim 9 in which the laser comprises YAG doped with holmium or erbium.

12. The method of claim 1 in which the layers have a combined depth of greater than 25 μm.

13. The method of claim 1 in which the spatial spot size defines a spot area that is smaller than and lies within a spatial region of the target, the method further comprising:

directing the laser output pulses sequentially to multiple positions associated with the spatial region to remove multiple amounts of target material corresponding to the spot areas.

14. The method of claim 13 in which the spatial region has a periphery and the multiple positions to which the laser output pulses are directed define a contiguous set of spot areas along the periphery of the spatial region to remove the target material within the spatial region and thereby produce a hole through the target material.

15. The method of claim 14 in which the target comprises at least an organic dielectric material, a reinforcement material, and a metal; and in which the organic dielectric material comprises PTFE, polyimides, epoxies, BT, phenolics, cyanate esters, paper, cardboard, or combinations thereof; the reinforcement material comprises glass, aramid fibers, Kevlar™, ceramics, or combinations thereof; and the metal comprises aluminum, titanium, nickel, copper, tungsten, platinum, gold, molybdenum, palladium, silver, or combinations thereof.

16. The method of claim 15 in which the spatial spot size is less than about 50 μm in diameter and the layers have a combined depth of greater than about 25 μm.

17. The method of claim 15 in which the target comprises a circuit board.

18. The method of claim 13 in which the spatial region has a periphery and a central portion and in which the multiple positions to which the laser output pulses are directed define a contiguous set of spot areas extending outwardly from the central portion along a path to the periphery of the spatial region to remove the target material from the spatial region and thereby produce a blind via in the target material.

19. The method of claim 18 in which the path is generally of spiral shape.

20. The method of claim 1 in which a single pulse cleanly removes material from at least two layers within the spatial spot size.

21. The method of claim 1 further comprising creating a blind via having a depth:diameter aspect ratio that is greater than 1.

22. The method of claim 1 further comprising creating a via having a depth:diameter aspect ratio that is greater than 2.

23. The method of claim 22 in which the via is a through hole.

24. The method of claim 1 in which the target comprises a circuit board.

25. The method of claim 1 further comprising:

forming a via having a depth of greater than 25 μm and having a diameter greater than that of the spatial spot size and smaller than about 300 μm.

26. The method of claim 1 in which the layers comprise any combination of at least two of the following chemical compositions:

inorganic reinforcement material, or metal or combination of metals, or organic dielectric material with or without organic reinforcement material.

27. A method for laser processing a multi-layered target including at least two layers having different chemical compositions, comprising:

generating high power ultraviolet laser output pulses having a predetermined spatial spot size, a wavelength shorter than about 400 nm, a temporal pulse width shorter than about 100 ns, and an average output power of greater than about 100 mW measured over the spatial spot size; and applying the laser output pulses to the target so that at least one of the laser output pulses simultaneously removes material from at least two layers within the spatial spot size and the laser output pulses cleanly remove at least two layers within the spatial spot size.

28. The method of claim 27 further comprising:

forming a via having a diameter greater than that of the spatial spot size and smaller than about 300 μm, the via also having a depth of greater than 25 μm and the laser output pulses being generated at a repetition rate of greater than about 1 kHz.

29. The method of claim 28 in which the layers comprise any combination of at least two of the following chemical compositions:

inorganic reinforcement material, or metal or combination of metals, or organic dielectric material with or without organic reinforcement material.

30. The method of claim 29 in which the spatial spot size is less than about 50 μm in diameter.

* * * * *

(12) EX PARTE REEXAMINATION CERTIFICATE (7102nd)
United States Patent
Owen et al.

(10) Number: US 5,593,606 C1
(45) Certificate Issued: Oct. 13, 2009

(54) ULTRAVIOLET LASER SYSTEM AND METHOD FOR FORMING VIAS IN MULTI-LAYERED TARGETS

(75) Inventors: Mark D. Owen, Beaverton, OR (US); James N. O'Brien, Bend, OR (US)

(73) Assignee: Electro Scientific Industries, Inc., Portland, OR (US)

Reexamination Request:
No. 90/008,961, Dec. 13, 2007

Reexamination Certificate for:
Patent No.: 5,593,606
Issued: Jan. 14, 1997
Appl. No.: 08/276,797
Filed: Jul. 18, 1994

(51) Int. Cl.
*B23K 26/40* (2006.01)
*B23K 26/38* (2006.01)
*B23K 26/00* (2006.01)
*C23C 14/04* (2006.01)
*C23C 14/28* (2006.01)
*H05K 3/00* (2006.01)
*H05K 3/40* (2006.01)
*H05K 3/42* (2006.01)
*H05K 3/02* (2006.01)

(52) U.S. Cl. .................. 219/121.71; 219/121.8
(58) Field of Classification Search .................. None
See application file for complete search history.

(56) References Cited

U.S. PATENT DOCUMENTS

| 3,931,458 A | 1/1976 | Dini |
| 5,144,630 A | 9/1992 | Lin |

FOREIGN PATENT DOCUMENTS

| JP | 62067834 | 3/1987 |
| JP | 01266983 | 10/1989 |

OTHER PUBLICATIONS

Boogaard, Jerry, "Precision laser micromachining," SPIE vol. 611, Laser Processing of Semiconductors and Hybrids, 1986.
Kato, Kiyoshi, "Fourth and Fifth Harmonic Generation of Nd: YAG Laser in Beta–BaB2O4," The Review of Laser Engineering, Jan. 1990, vol. 18, No. 1.
Ishii, Yoshito, et al., "The Problems and Improvements for Processing of Printed Circuit Board by the Laser Ablation," Bulletin of the College of Engineering, Nihon University, Category A Engineering, Volume No. 33, Mar. 4, 1992.
Liu, Y.S., "Laser ablation of polymers for high density interconnect," Microelectronic Engineering, vol. 20, No. 1 & 2, Mar. 1993.
Gotoh, et al., "High–average–power 266mn Generation of Nd: YAG Laser and its Industrial Applications," vol. 21, No. 8, Laser Research, Sep. 1993.
E.S.I. Japan Ltd., Optronics No. 135, Mar. 10, 1993.

*Primary Examiner*—Krisanne Jastrzab

(57) ABSTRACT

The output of a continuously pumped, Q-switched, Nd:YAG laser (10) is frequency converted to provided ultraviolet light (62) for forming vias (72, 74) in multi-layered targets (40). The parameters of the output pulses (62) are selected to facilitate substantially clean, simultaneous or sequential drilling or via formation in a wide variety of materials such as metals, organic dielectrics, and reinforcement materials having different thermal absorption characteristics in response to ultraviolet light. These parameters typically include at least two of the following criteria: high average power of greater than about 100 milliwatts measured over the beam spot area, a temporal pulse width shorter than about 100 nanoseconds, a spot diameter of less than about 50 microns, and a repetition rate of greater than about one kilohertz. The laser system (10) and method circumvent conventional depth of cut saturation limitations and can achieve an increased depth of cut per pulse in a target (40) formed of either single- or multi-layered material.

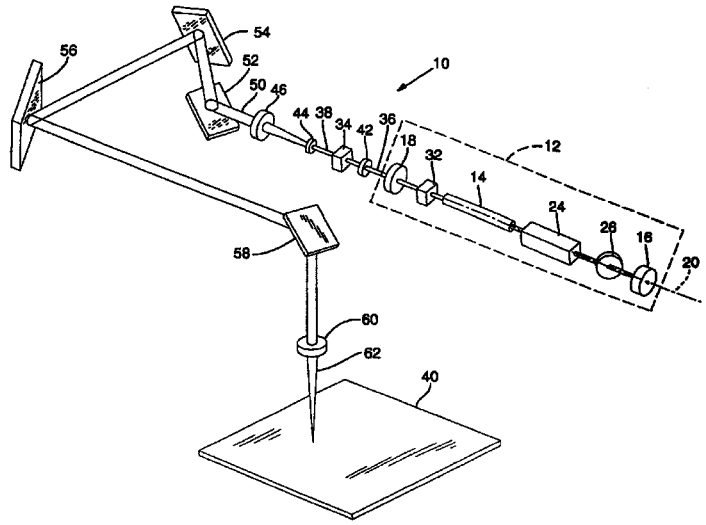

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1–30 are cancelled.

\* \* \* \* \*